United States Patent [19]

Murray-Shelley

[11] Patent Number: 5,090,033
[45] Date of Patent: Feb. 18, 1992

[54] ELECTRICAL COUNTER HAVING PLURAL UNIT VALUE REGISTERS

[75] Inventor: Richard Murray-Shelley, Pontypridd, Wales

[73] Assignee: Smiths Industries Public Limited Company, London, England

[21] Appl. No.: 600,699

[22] Filed: Oct. 22, 1990

[30] Foreign Application Priority Data

Oct. 20, 1989 [GB] United Kingdom ............... 8923672

[51] Int. Cl.$^5$ ........................................... H03K 21/40
[52] U.S. Cl. ......................................... 377/28; 377/26; 377/15; 364/944.92
[58] Field of Search ............ 377/24.1, 2, 28, 26; 364/900

[56] References Cited

U.S. PATENT DOCUMENTS

| | | | |
|---|---|---|---|
| 4,223,379 | 9/1980 | Simcoe | 377/2 |
| 4,663,770 | 5/1987 | Murray et al. | 377/28 |
| 4,757,522 | 7/1988 | Kieselstein | 377/28 |
| 4,807,264 | 2/1989 | Bauer | 377/28 |
| 4,947,410 | 8/1990 | Lippmann et al. | 377/24.1 |
| 4,993,051 | 2/1991 | Feldbrugge | 377/28 |

FOREIGN PATENT DOCUMENTS 2180083  3/1987  United Kingdom .

Primary Examiner—John S. Heyman
Attorney, Agent, or Firm—Pollock, VandeSande and Priddy

[57] ABSTRACT

An autoclave or other equipment has a counter provided by an EEPROM for counting the number of times the autoclave has been used. The EEPROM has a first set of ten registers which contain the unit value of the count together with a fault code associated with the last use of the autoclave. Two further registers contain the hundreds and tens, and the ten thousands and thousands value of the count. The tens value in one of the further registers is used to determine in which of the registers of the first set the units value is stored, so that each of the registers in the first set is only written into ten times for every hundred counts, thereby extending the life of the EEPROM. Another register in the EEPROM contains information about the nature of the autoclave.

10 Claims, 1 Drawing Sheet

| COUNT | REGISTER | R2 | R3 | R4 | R5 | R6 | R7 | R8 | R9 | R10 | R11 | R12 | R13 |
|---|---|---|---|---|---|---|---|---|---|---|---|---|---|
| 01234 | | 01 | 23 | | | 4 | | | | | | | |
| 01235 | | 01 | 23 | | | 5 | | | | | | | |
| 01241 | | 01 | 24 | | | | 1 | | | | | | |
| 01261 | | 01 | 26 | | | | | | 1 | | | | |
| 01288 | | 01 | 28 | | | | | | | | 8 | | |
| 56390 | | 56 | 39 | | | | | | | | | | 0 |

ELECTRICAL COUNTER HAVING PLURAL UNIT VALUE REGISTERS

BACKGROUND OF THE INVENTION

This invention relates to electrical counters and to equipment including such counters.

In many applications it is desirable to maintain a count, such as of the number of times equipment has been operated. It can also be desirable to store information about the operation of that equipment in the counter, such as may be indicative of a fault in its operation.

Various electrical stores are available which can maintain such a count and store a fault code or the like. Most of these stores, however, are relatively expensive. At least one form of low cost store is, however, available in the form of an electrically-erasable programmable read only memory (EEPROM). Currently available EEPROM's, however, suffer from the disadvantage that the action of writing into the store deteriorates the device. This limits reliable operation to about 10,000 write cycles for each register in the store. Where the EEPROM is used to store both counter information and fault status data or the like, at least two write operations are required each cycle, thereby limiting use of the store to about 5000 operations.

BRIEF SUMMARY OF THE INVENTION

It is an object of the present invention to provide an electrical counter which can be used to increase the life of such stores.

According to one aspect of the present invention there is provided an electrical counter including a first set of a plurality of registers and at least one further register, one of the registers of the first set containing the unit value of a count, the further register containing the tens value of the count, and the tens value in the further register determining which register of the first set contains the unit value.

According to another aspect of the present invention there is provided an electrical counter including a first set of a plurality of registers and at least one further register, means for entering the tens value of a count into the further register and means for entering the unit value of the count in one of the registers of the first set, the register of the first set in which the unit value is entered being selected in accordance with the tens value in the further register.

The first set of registers preferably comprises ten registers. The counter may be arranged to enter in the first set of registers information in respect of an event associated with the respective count, such as, for example a code indicating the nature of a fault associated with equipment the operation of which is being counted.

The registers are preferably implemented in an EEPROM and may be sixteen bit registers.

The counter may include two further registers, one of the further registers containing the hundreds and tens value of the count and the other of the further registers containing the ten thousands and thousands value of the count. Where the counter counts operation of equipment, the counter may include an additional register which contains information relating to the nature of the equipment.

According to a further aspect of the present invention there is provided equipment including an electrical counter according to the above one or other aspect of the invention, the counter being arranged to count operation of the equipment. The equipment may be an autoclave and may include a visual display arranged to provide a display representation of the count in the counter.

An autoclave including a counter, in accordance with the present invention, will now be described, by way of example, with reference to the accompanying drawings.

DESCRIPTION OF THE PREFERRED EMBODIMENTS

Figures 1, 2:
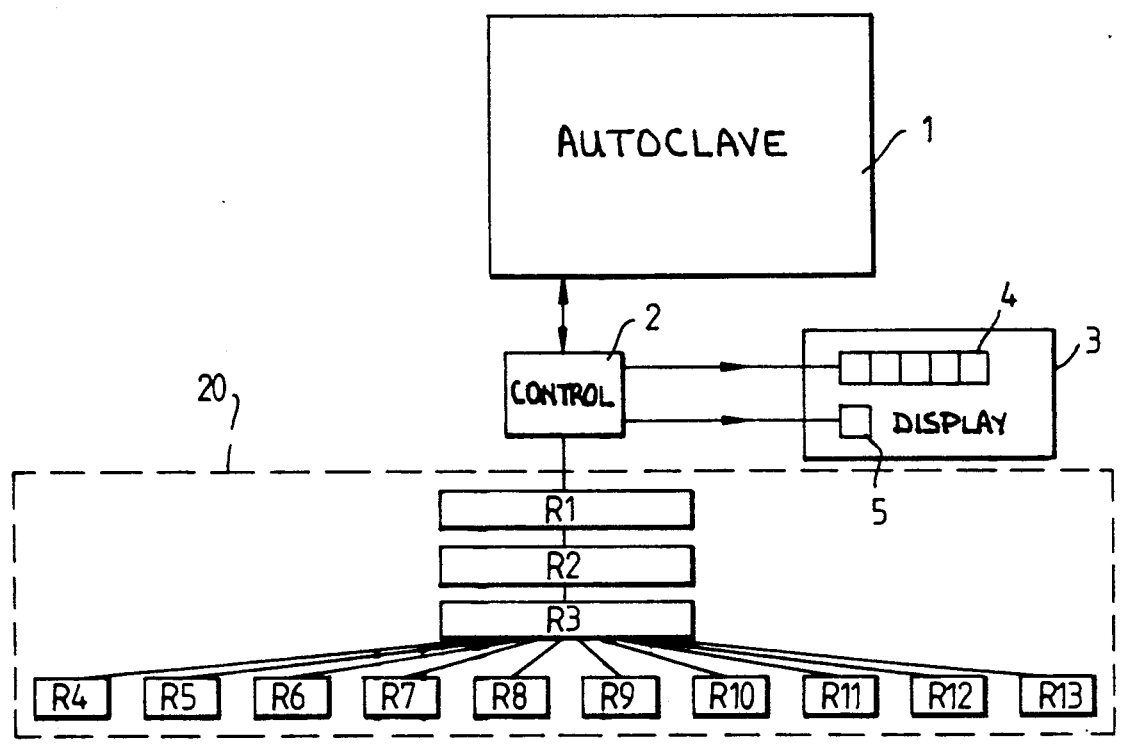
FIG. 1 shows the autoclave schematically.
FIG. 2 is a table illustrating different values of counter in a counter of the autoclave.

With reference to FIG. 1, the autoclave includes a pressure vessel 1 in which articles to be sterilized are placed and subjected to high temperature and pressure in the presence of water vapour. The autoclave includes various components such as a heater, control buttons, valves, timers, sensors and the like which are entirely conventional and are not shown here, for simplicity. Operation of the autoclave is controlled by a control unit 2 which receives the inputs from the various sensors, controls the timing operations and identifies any faults in the equipment. A display panel 3 connected with the control unit 2 has a first area 4, in which a visual display is provided of the number of times the equipment has been operated, and second area 5 in which a code number is displayed indicating the nature of any fault. Other information such as temperature, pressure, time, operating instructions and the like can also be provided in different areas (not shown) in conventional manner.

Coupled with the control unit 2 is a counter provided by a store 20 in the form of a type 9306 256 bit EEPROM which has sixteen, separately-addressable, sixteen bit registers only thirteen of which R1 to R13 are implemented in the present invention.

The first register R1 contains information about the personality or nature of the equipment such as: the model type; the message displayed on the panel 3 at various points in the equipment operation; the language used, that is, English, French, German or Italian; the display resolution; and other data relating to operation of the equipment.

The second register R2 contains only the value of the ten thousands and thousands of the counter, limiting counter operation to 99,999.

The third register R3 contains only the value of the hundreds and tens of the counter.

The current counter units value is stored in one of a set of ten registers R4 to R13. The particular one of the set of ten register R4 to R13 utilized is dependent on the tens value of the count as stored in the register R3, that is, the value in the register R3 is responsible for which one of the registers R4 to R13 is addressed, as illustrated in FIG. 2.

If the tens value in register R3 is, for example, this will address register R4, if the tens value is 20 this will address register R5 and so on, as shown in the table below:

| Tens Value | Register |
|---|---|
| 10 | R4 |
| 20 | R5 |
| 30 | R6 |
| 40 | R7 |
| 50 | R8 |
| 60 | R9 |
| 70 | R10 |
| 80 | R11 |
| 90 | R12 |
| 00 | R13 |

For example, for the first count shown in FIG. 2, that is 01234, register R2 will contain value 01, register R3 will contain value 23 and the units value 4 will be contained in register R6. For the count 01235, the units value 5 will be stored in the same register R6 because the tens value is unchanged. When the tens value changes, such as in the count 01241, the units value 1 will be stored in the register R7 associated with the tens In addition to the count value, each of the units registers R4 to R13 stores a fault code 0 to 9, the code 0 being indicative of correct operation.

Each time that the autoclave starts a sterilizing cycle, the control unit 2 supplies a pulse to the store 20 to increase the value of the counter by one unit. When a fault occurs, the appropriate code number is stored in the register R4 to R13 associated with that particular cycle of the autoclave. Operation of the autoclave is stopped, reverting to a safe mode in which the heater is turned off, pressure is released and the door is maintained locked. The fault code will also be displayed in the area 5 but, even if the autoclave is disconnected from mains power, the fault code will remain in the store 20 and can be read by the maintenance engineer when power is reconnected.

It can be seen that each of the units registers R4 to R13 is only written into ten times for every hundred counts, that is, for one tenth of the total counts. Because each write operation degrades the register, it can be seen that the arrangement of the present invention effectively increases the reliable life of the EEPROM by a factor of ten.

The invention could be used for other counter applications and is not restricted to use in autoclaves.

What I claim is:

1. An electrical counter for storing a count comprising: a first set of a plurality of registers dedicated solely to the storage of information associated with unit value of the count; and at least one further register for containing the tens value of the count, said further register being operative to control into which of the registers of the first set the unit value is entered in accordance with the tens value in the further register such that only one of the registers of the first set contains the unit value of the count and the others of the registers of the first set contain no information on the count.

2. An electrical counter according to claim 1, wherein said first set of registers comprises ten registers.

3. An electrical counter according to claim 1, wherein the counter enters in said first set of registers information in respect of an event associated with the respective count.

4. An electrical counter according to claim 3 for counting operation of equipment, wherein said information is a code indicating the nature of a fault associated with the equipment.

5. An electrical counter according to claim 1, wherein the registers are implemented in an EEPROM.

6. An electrical counter according to claim 1, wherein the registers are sixteen bit registers.

7. An electrical counter according to claim 1, including two further registers, wherein the counter enters the hundreds and tens value of the count in one of the further registers and enters the ten thousands and thousands value of the count in the other of the further registers.

8. An electrical counter according to claim 1 for counting operation of equipment, wherein the counter includes an additional register and wherein said additional register contains information relating to the nature of the equipment.

9. In equipment of the kind including a visual display and a counter which counts the operation of the equipment, the improvement wherein the counter includes a first set of a plurality of registers dedicated solely to the storage of information associated with the unit value of the count, and at least one further register for containing the tens value of the count, said further register controlling into which of the registers of the first set the unit value is entered in accordance with the tens value in the further register such that only one of the registers of the first set contains the unit value of the count and the others of the registers of the first set contain no information on the count, and wherein the contents of the counter are represented on the visual display.

10. In an autoclave of the kind comprising a pressure vessel, a control unit that controls operation of the autoclave, and a counter that counts the number of operations of the autoclave, the improvement wherein the counter includes a first set of a plurality of registers dedicated solely to the storage of information associated with the unit value of the count, and at least one further register for containing the tens value of the count, said further register controlling into which of the registers of the first set the unit value is entered in accordance with the tens value in the further register such that only one of the registers of the first set contains the unit value of the count and the others of the registers of the first set contain no information on the count.

* * * * *